United States Patent
Kosowsky et al.

(10) Patent No.: US 9,007,165 B2
(45) Date of Patent: Apr. 14, 2015

(54) SUBSTRATE DEVICE OR PACKAGE USING EMBEDDED LAYER OF VOLTAGE SWITCHABLE DIELECTRIC MATERIAL IN A VERTICAL SWITCHING CONFIGURATION

(75) Inventors: Lex Kosowsky, San Jose, CA (US); Robert Fleming, San Jose, CA (US); Bhret Graydon, San Jose, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 13/524,776

(22) Filed: Jun. 15, 2012

(65) Prior Publication Data

US 2012/0256721 A1   Oct. 11, 2012

Related U.S. Application Data

(63) Continuation of application No. 12/417,589, filed on Apr. 2, 2009, now Pat. No. 8,203,421.

(60) Provisional application No. 61/044,883, filed on Apr. 14, 2008.

(51) Int. Cl.
  *H01C 7/10*  (2006.01)
  *H05K 1/02*  (2006.01)
  *H05K 1/03*  (2006.01)

(52) U.S. Cl.
  CPC ........... *H05K 1/0257* (2013.01); *H05K 1/0259* (2013.01); *H05K 1/0373* (2013.01); *H05K 2201/0738* (2013.01); *H05K 2203/105* (2013.01)

(58) Field of Classification Search
  USPC ...................................... 338/20, 21
  See application file for complete search history.

(56) References Cited

U.S. PATENT DOCUMENTS

| | | | |
|---|---|---|---|
| 8,203,421 B2 * | 6/2012 | Kosowsky et al. | 338/21 |
| 2010/0159259 A1 * | 6/2010 | Kosowsky et al. | 428/457 |
| 2010/0187483 A1 * | 7/2010 | Fleming et al. | 252/506 |
| 2011/0211319 A1 * | 9/2011 | Kosowsky et al. | 361/763 |
| 2012/0119168 A9 * | 5/2012 | Fleming et al. | 252/519.34 |

* cited by examiner

*Primary Examiner* — James Harvey
(74) *Attorney, Agent, or Firm* — Kacvinsky Daisak Bluni PLLC

(57) ABSTRACT

A substrate device includes an embedded layer of VSD material that overlays a conductive element or layer to provide a ground. An electrode, connected to circuit elements that are to be protected, extends into the thickness of the substrate to make contact with the VSD layer. When the circuit elements are operated under normal voltages, the VSD layer is dielectric and not connected to ground. When a transient electrical event occurs on the circuit elements, the VSD layer switches instantly to a conductive state, so that the first electrode is connected to ground.

9 Claims, 4 Drawing Sheets

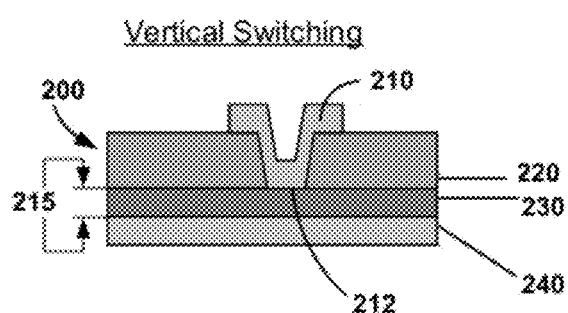
FIG. 2A
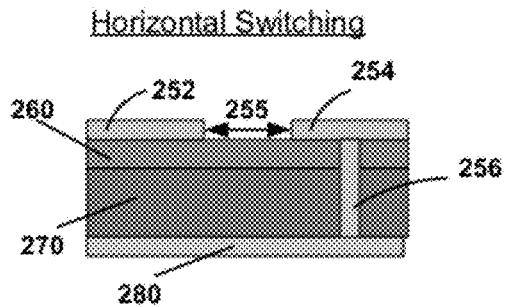
FIG. 2B
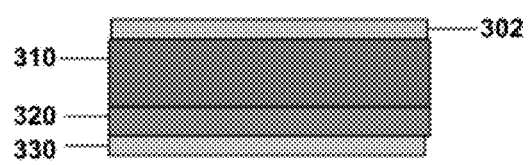
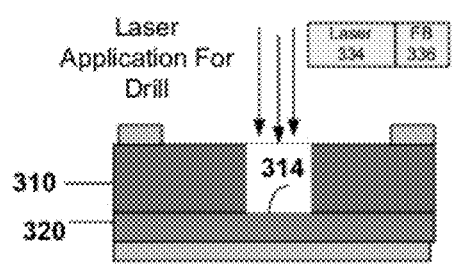
FIG. 3A
FIG. 3B
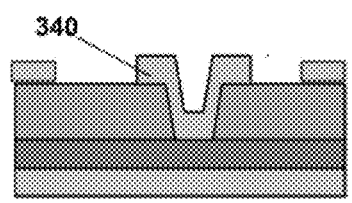
FIG. 3C

US 9,007,165 B2

SUBSTRATE DEVICE OR PACKAGE USING EMBEDDED LAYER OF VOLTAGE SWITCHABLE DIELECTRIC MATERIAL IN A VERTICAL SWITCHING CONFIGURATION

RELATED APPLICATIONS

This Application is a continuation of U.S. Utility application Ser. No. 12/417,589, filed Apr. 2, 2009, now U.S. Pat. No. 8,203,421, which claims benefit of priority to Provisional U.S. Patent Application No. 61/044,883, filed Apr. 14, 2008; the aforementioned priority applications being hereby incorporated by reference in their entireties.

FIELD OF THE INVENTION

Embodiments described herein pertain to substrate devices and packages that utilize voltage switchable dielectric material. In particular, embodiments described herein pertain to substrate devices and packages that embed layer(s) of voltage switchable dielectric material in a vertical switching configuration.

BACKGROUND

Voltage switchable dielectric (VSD) materials are known to be materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein.

VSD materials may be formed using various processes and materials or compositions. One conventional technique provides that a layer of polymer is filled with high levels of metal particles to very near the percolation threshold, typically more than 25% by volume. Semiconductor and/or insulator materials are then added to the mixture.

Another conventional technique provides for forming VSD material by mixing doped metal oxide powders, then sintering the powders to make particles with grain boundaries, and then adding the particles to a polymer matrix to above the percolation threshold.

Other techniques and compositions for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

BRIEF DESCRIPTION OF THE FIGURES

FIG. 2A illustrate a substrate device having an embedded layer of VSD material that is positioned on the substrate to switch vertically, according to an embodiment.

FIG. 2B illustrates a lateral switching alignment for a substrate device.

FIG. 3A through FIG. 3C depict a process or technique for creating a substrate device such as shown and depicted by an embodiment of FIG. 2A.

DETAILED DESCRIPTION

Figure 1:
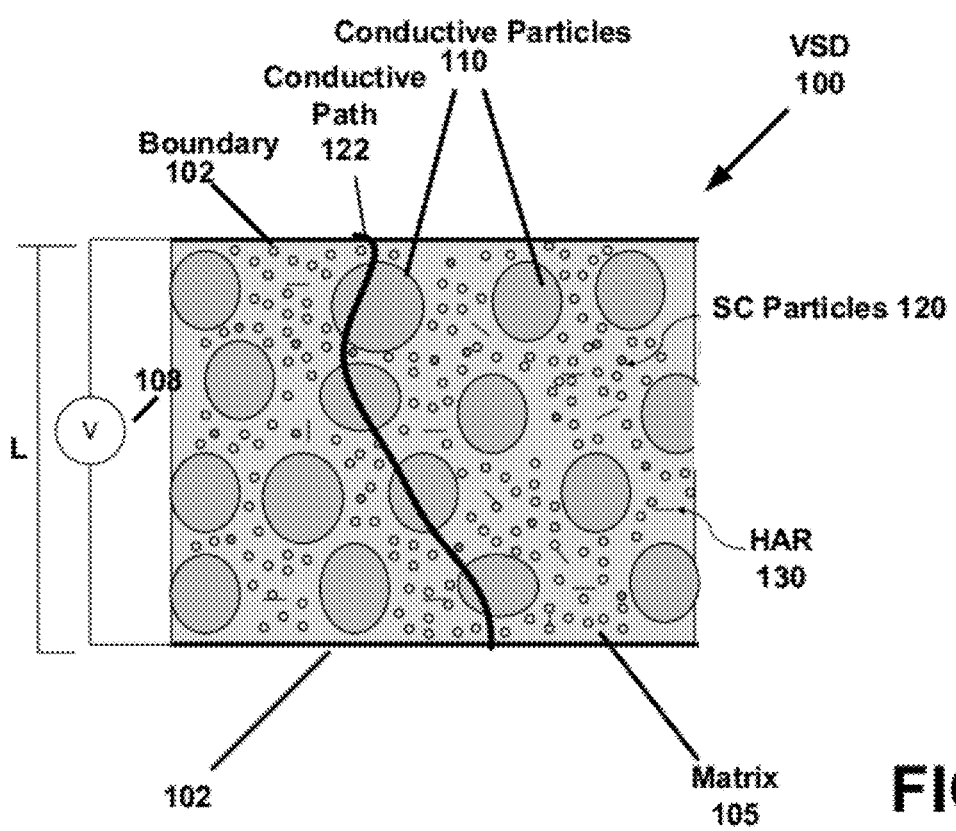
FIG. 1 is an illustrative (not to scale) sectional view of a layer or thickness of VSD material, depicting the constituents of VSD material in accordance with various embodiments.

Embodiments described herein pertain to substrate devices and packages that embed layer(s) of voltage switchable dielectric (VSD) material in a vertical switching configuration.

According to an embodiment, a substrate device includes an embedded layer of VSD material that overlays a conductive element or layer to provide a ground. An electrode, connected to circuit elements that are to be protected, extends into the thickness of the substrate to make contact with the VSD layer. When the circuit elements are operated under normal voltages, the VSD layer is non-conductive, and the first electrode is not connected to ground. When a transient electrical event occurs on the circuit elements, the VSD layer switches instantly to a conductive state, so that the first electrode is connected to ground. The configuration protects the circuit elements and connected devices that connect to the first electrode from the transient electrical event.

According to an embodiment, a substrate device vertically spaces two electrodes from one another, with a first one of the electrodes connecting to circuit elements and devices that are to be protected, and a second one of the electrodes connecting to ground. A layer of VSD material is positioned over the second electrode, and overlaid by electrically isolative material (i.e. prepreg or B-stage resin). The electrically isolative material may be characterized as material having a high dielectric constant. According to an embodiment, the first electrode extends vertically through the layer of dielectric so as to make contact with VSD material.

Still further, embodiments provide that the first electrode is structured to extend into the dielectric layer to reach the VSD material with precision depth drilling. An embodiment provides for use of a laser to create an opening from which the first electrode is formed.

A configuration such as formed enables VSD material to be vertically switched, in order to electrically connect the first electrode and the second electrode (which is grounded) during an electrical transient event.

Still further, in another embodiment, a substrate device is provided that includes a first electrode and a grounding plane or other electrode. The first electrode and the grounding plane are separated by a thickness that defines a vertical dimension. A layer of VSD material is provided over, or in at least partial contact with the second electrode, so as to be embedded in the thickness. The VSD material is triggerable to switch from a dielectric state into a conductive state with application of energy (voltage or current) that exceeds a designated threshold level. A grounding path may extend in the vertical dimension from at least the first electrode to the grounding plane. The grounding path includes at least a thickness of the layer of VSD material. The grounding path is only electrically conductive or active in presence of a transient electrical event that supplies energy in excess of the designated threshold of the VSD material.

Still further, embodiments described herein recognize, that in the context of a substrate device, a laser may be used to form a hole or opening that extends from an electrode layer through an interior thickness of electrically isolative material (e.g. prepreg) and into an embedded layer of VSD material. In particular, one or more embodiments recognize that a laser (e.g. YAG laser) may be used to drill a hole that touches the embedded layer of VSD material without degradation of the VSD material or other unwanted effects from the use of the laser. Such a laser may be tuned to precisely detect the transition from electrically isolative material to VSD material, so as to create the opening or hole without removing any significant quantity of VSD material. In one embodiment, the layer of VSD material that underlies the opening formed by the laser has a thickness that is substantially the same as its thickness prior to the formation of the opening.

As used herein, the term 'substantially' means within 99% of a stated amount.

As used herein, the term "programmatically" means through execution of code or instructions, as performed by a processor, computer, or processing resource (e.g. processor or integrated circuits).

Voltage Switchable Dielectric (VSD) Material

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric unless voltage (or field) exceeding the characteristic level (e.g. such as provided by ESD events) is applied to the material, in which case the VSD material is switched into a conductive state. VSD material can further be characterized as a nonlinear resistance material. In many applications, the characteristic voltage of VSD material ranges in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder (i.e. it is non-conductive or dielectric).

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

According to embodiments described herein, the constituents of VSD material may be uniformly mixed into a binder or polymer matrix. In one embodiment, the mixture is dispersed at nanoscale, meaning the particles that comprise the conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, thin-film electronics, Light Emitting Diodes (LEDs), radio-frequency (RF) components, and display devices.

Some compositions of VSD materials work by loading conductive and/or semiconductive materials into a polymer binder in an amount that is just below percolation. Percolation may correspond to a statistically defined threshold by which there is a continuous conduction path when a relatively low voltage is applied. Other materials insulative or semiconductive materials may be added to better control the percolation threshold. Still further, some embodiments may compose VSD material from varistor particles dispersed in a polymer resin.

FIG. 1 is an illustrative (not to scale) sectional view of a layer or thickness of VSD material, depicting the constituents of VSD material in accordance with various embodiments. As depicted, VSD material 100 includes matrix binder 105 and various types of particle constituents, dispersed in the binder in various concentrations. The particle constituents of the VSD material may include metal particles 110, semiconductor particles 120, and high-aspect ratio (HAR) particles 130. It should be noted that the type of particle constituent that are included in the VSD composition may vary, depending on the desired electrical and physical characteristics of the VSD material. For example, some VSD compositions may include metal particles 110, but not semiconductive particles 120 and/or HAR particles 130. Still further, other embodiments may omit use of conductive particles 110.

Examples for matrix binder 105 include polyethylenes, silicones, acrylates, polymides, polyurethanes, epoxies, polyamides, polycarbonates, polysulfones, polyketones, and copolymers, and/or blends thereof.

Examples of conductive materials 110 include metals such as copper, aluminum, nickel, silver, gold, titanium, stainless steel, chrome, other metal alloys, or conductive ceramics like titanium diboride. Examples of semiconductive material 120 include both organic and inorganic semiconductors. Some inorganic semiconductors include, silicon carbide, boron nitride, aluminum nitride, nickel oxide, zinc oxide, zinc sulfide, bismuth oxide, titanium dioxide, cerium oxide, bismuth oxide, in oxide, indium in oxide, antimony in oxide, and iron oxide. The specific formulation and composition may be selected for mechanical and electrical properties that best suit the particular application of the VSD material. The HAR particles 130 may be organic (e.g. carbon nanotubes, graphene) or inorganic (e.g. nano-wires or nanorods), and may be dispersed between the other particles at various concentrations. More specific examples of HAR particles 130 may correspond to conductive or semi-conductive inorganic particles, such as provided by nanowires or certain types of nanorods. Material for such particles include copper, nickel, gold, silver, cobalt, zinc oxide, in oxide, silicon carbide, gallium arsenide, aluminum oxide, aluminum nitride, titanium dioxide, antimony, boron nitride, in oxide, indium in oxide, indium zinc oxide, bismuth oxide, cerium oxide, and antimony zinc oxide.

The dispersion of the various classes of particles in the matrix 105 may be such that the VSD material 100 is non-layered and uniform in its composition, while exhibiting electrical characteristics of voltage switchable dielectric material.

Generally, the characteristic voltage of VSD material is measured at volts/length (e.g. per 5 mil), although other field measurements may be used as an alternative to voltage. Accordingly, a voltage 108 applied across the boundaries 102 of the VSD material layer may switch the VSD material 100 into a conductive state if the voltage exceeds the characteristic voltage for the gap distance L. In the conductive state, the matrix composite (comprising matrix binder 105 and particles constituents) conducts charge (as depicted by conductive path 122) between the conductive particles 110, from one boundary of VSD material to the other. One or more embodiments provide that VSD material has a characteristic voltage level that exceeds that of an operating circuit. As mentioned, other characteristic field measurements may be used.

Specific compositions and techniques by which organic and/or HAR particles are incorporated into the composition of VSD material is described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES; both of the aforementioned patent applications are incorporated by reference in their respective entirety by this application.

In an embodiment in which VSD material is formed from varistor particles dispersed in a polymer resin, metal oxide varistors may be formed using Bi, Cr, Co, Mn, and Sb. The composition may be formed using doped ZnO powder that is sintered at 800 C to 1300 C, although other temperature ranges may be used. The sintering results in electrical particles having electrical conductivity which changes as a non-linear function against applied electrical field.

Vertical Switching with Embedded VSD Material

One manner in utilizing VSD material is to embed the VSD material as a layer on a substrate device. The layer VSD material is positioned to electrically interconnect a circuit element of the substrate with a ground element with occurrence of a transient electrical event that exceeds the characteristic threshold of the VSD material. The substrate device may integrate the layer of VSD material in order to enable the layer to switch (to conductive state) vertically or horizontally.

FIG. 2A illustrate a substrate device having an embedded layer of VSD material that is positioned on the substrate to switch vertically, according to an embodiment. With reference to FIG. 2A, the substrate device 200 includes a first electrode 210, a layer of electrically isolative material 220, a layer of VSD material 230, and a second electrode 240. The electrically isolative material may correspond to, for example, prepreg, B-stage resin, a polyimide (or a high dielectric constant material). As a specific example, the electrically isolative layer may correspond or include epoxy impregnated glass cloth. The first electrode 210 extends a depth into the layer 220, so that a portion 212 of the electrode is in physical contact with the layer of VSD material 230. The second electrode 240 may also be embedded or provided on an underside of the substrate device. The second electrode 240 is connected to ground.

The use of electrically isolative material 220 such as prepreg enables larger portions of the substrate to be interconnected and extended to a common grounding plane. Among other benefits, prepreg and other electrically isolative material enables circuit elements to be routed and traced without electrical interference. In the context of embodiments described herein, the electrically isolative material 220 enables the surface electrodes (as exemplified by first electrode 210) to be routed to the grounding plane with minimal leakage current, coupling or other electrical interference.

According to an embodiment, the first electrode 210 is electrically connected on the substrate device to a circuit, component or region that is to be protected from transient electrical events. The first electrode 210 is separated from the second electrode 240 by a gap 215 that is corresponds to at least a significant portion (e.g. 80%) of the thickness of the VSD layer 230 (extended beyond the portion that underlies the first electrode 210). In an embodiment, the first electrode 210 (i) is formed after the layer of VSD material is deposited, (ii) extended to the layer of VSD material without affecting the thickness of the VSD material in any measurable amount or significance. For example, the gap 215 separating the first and second electrodes 210, 240 may be dimensioned to be more than 99% of the thickness of the layer of VSD material 230 before the formation of the first electrode 210. However, as depicted by an embodiment of FIG. 7, the gap 215 may be formed to have dimensions that are less than the thickness of the VSD material without intrusion from the first electrode 210. For example, gap 215 may occupy, 25%, 50% or 75% of the thickness of the VSD material adjacent to the intrusion of the first electrode 210.

When a transient electrical event occurs, the first electrode 210 carries current from the event vertically to the layer of VSD material 230, so as to cause the VSD material to instantly switch into the conductive state. The VSD material switches vertically across gap 215 to electrically connect the first electrode 210 and the second electrode (ground). In this way, the first electrode 210 and the second electrode 240 are electrically interconnected, and the second electrode is connected to a grounding plane or element so as to enable the transient event to be grounded.

As a comparison to an embodiment such as shown by FIG. 2A, FIG. 2B illustrates a lateral switching alignment for a substrate device. In a typical configuration, conductive elements, including a first electrode 252 and a second electrode 254 are positioned above a layer of VSD material 260. A lateral gap 255 is formed, typically by removing conductive elements from the layer using etching or other processes. If prepreg or other electrically isolative material 270 is to be used, the VSD material 260 is typically overlaid on the prepreg. Another layer of conductive material 280 may extend a grounding path to the second electrode 254 through a via 256 or other electrical interconnect. When the transient electrical event occurs, a portion of the VSD material 260 extending between the first and second conductive elements is switched into the conductive state, so as to electrically interconnect the first electrode 252 to the grounding path that is provided by the second electrode 254.

An embodiment such as shown by FIG. 2A offers numerous advantages over a lateral switching alignment such as depicted in FIG. 2A. In a lateral switching configuration, the gap 255 is formed by processes (e.g. etching) that have relatively high tolerances. As such, the gap 255 is difficult to form, particular to specific tolerances or measurements. Embodiments recognize that the gap 255 is the critical dimension for when the VSD material switches. Variations in the gap 255 affect the clamp/trigger voltage required to switch the layer of VSD material 260. As a dimension for lateral switching, the dimension is very difficult to control during manufacturing, particularly for small gap sizes.

Furthermore, the planar geometric configuration shown in FIG. 2B promotes a non-uniform electric field distribution that causes potential local and high field concentration, particularly at the edge of the electrodes. Such non-uniformity can make the trigger/clamp voltage of the VSD material higher than a comparable vertical gap/switching arrangement.

Figure 7:
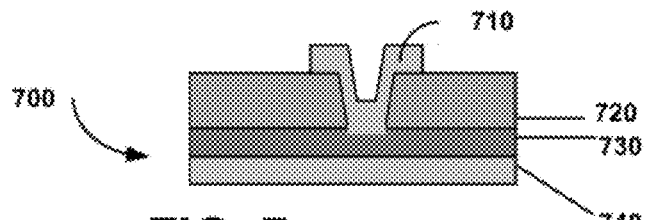
FIG. 7 illustrates a variation to an embodiment shown in FIG. 2A.

While an embodiment of FIG. 2A depicts a low tolerance gap formation for enabling VSD switching between two vertically separated electrodes, embodiments recognize that the gap formation does not have to be as precise as depicted in FIG. 2A. For example, an embodiment of FIG. 7 depicts a configuration in which the first electrode extends some depth into the layer of VSD material.

Vertical Structure Formation

FIG. 3A through FIG. 3C depict a process or technique for creating a substrate device such as shown and depicted by an embodiment of FIG. 2A.

In FIG. 3A, a multi-layered substrate device is formed that includes a layer of conductive material (e.g. copper). a layer of electrically isolative material 310, a layer of VSD material 320, and a conductive layer for providing ground 330. The formation of the substrate device in this stage may be referred to as a stack or stacked structure.

In FIG. 3B, an opening 314 is formed that extends through the electrically isolative material 310 and to the layer of VSD material 320. The opening 314 may be referred to as a microvia. The opening 314 may be precision formed, at least in the depth dimension, so that the formation of the opening stops at the VSD material 320. In one embodiment, the opening is drilled with a laser 334. The opening 314 may be formed as part of a process or series of processes that include printing, etching (conductive material) and drilling (including laser or precision drilling). In forming the opening, a YAG laser may be used to provide precision depth to the top layer or surface of the layer of VSD material. A YAG laser may include a mechanism 336 that enables it to automatically precision depth drill opening 114. In one embodiment, the amount of time/power in which the laser is needed to precision depth through the electrically isolative material may be a known parameter. Still further, an implementation may list or associate (e.g. via a table) power and time of operation of the laser with drill depth for a specific type of prepreg (or other electrically isolative material). With this information, the laser may be operated for a duration and power level to drill opening 114 to precisely reach VSD material. In some implementations, a process may be performed where the drilling is stopped to measure the depth of opening 114. Such a stop and go process may protect against, for example drilling beyond the transition line from prepreg to VSD material. In addition to precision depth drilling, the use of the laser also enables precession lateral drilling the X and Y directions.

In another embodiment, the laser 334 may be operated with an optional feedback mechanism 336, such as an optical sensor that detects the presence of VSD material at the bottom of the opening 314. Once the VSD material is detected, the laser drilling is stopped. In such an embodiment, the laser 334 may be configured with an integrated or separate component that is configured to programmatically detect the presence of the layer of VSD material 320, and more specifically, the transition from the dielectric thickness of the electrically isolative material 310 to the VSD material layer 320. The feedback mechanism 336 may incorporate processor(s) in combination with other resources such as memory, in order to evaluate characteristics pertaining to the output of the laser, and or optical characteristics of the material being drilled, in order to detect the transition to VSD material 320. Alternatively, the feedback mechanism 336 may be implemented with processing resources (such as firmware or hardware logic, including circuitry).

According to one or more embodiments, the use of the laser drill enables the opening 314 to reach the layer of VSD material 320 without removing any significant amount of material from that layer. In an embodiment, the laser removes less than 1% of the layer of VSD material. Embodiments further recognize that the laser can be controlled in lasing the prepreg (or other electrically isolative material) in depth to a tolerance of less than 100 angstroms, and even less than 10 angstroms.

FIG. 3C provides that the electrode 340 of the substrate device is formed over the opening 314. In an embodiment, the opening 314 is plated or otherwise provided with conductive material to form the electrode 340. The conductive material may line the walls or other vertical dimension of the opening 314.

Embodiments such as described with FIG. 2A and elsewhere in the application provide several benefits over more conventional approaches for providing vertical switching using VSD material. For example, while some past approaches have included layers of VSD material 320, those approaches have not used drilled holes or similar structures to provide the desired formation of the conductive opening. Drilling, including laser-drilling, enables more precision and tightly spaced gaps or thicknesses than etching, for example. As such, spacing or tolerance levels and dimensions in a structure such as shown and described with FIG. 1 may be tighter than those offered under many conventional approaches.

Moreover, past approaches for providing vertical switching of VSD material have not accounted for use of additional layers, such as prepreg or other electrically isolative material 310. Embodiments described herein provide for implementation of the VSD material into (or onto) various layers in the substrate device.

Still further, as compared to the conventional approaches, the use of embedded VSD material with vertical switching configuration enables a lower "turn on" or clamping voltages than that which can be reliably obtained from a conventional approach such as shown with FIG. 2B. As mentioned, this is because the vertical thickness (which is the electrode "gap" in an embodiment of FIG. 3C) can be more precisely controlled to smaller dimensions than printed circuit board and substrate manufacturing process (e.g. such as provided from etching).

According to an embodiment, a structure such as depicted by FIG. 3C (or alternatively by FIG. 2A) is capable of complete ESD protection for any net, pin, and pad on any circuit by simply providing one or more openings or micro via (uvia) that reach the layer of VSD material. In contrast, a horizontal switching orientation such as described with FIG. 2B only protects nets, pins, or pads that pass through the VSD material. In the horizontal switching orientation, many (e.g. 80%) of the pins on a conventional PCB would be left unprotected.

Figure 4:
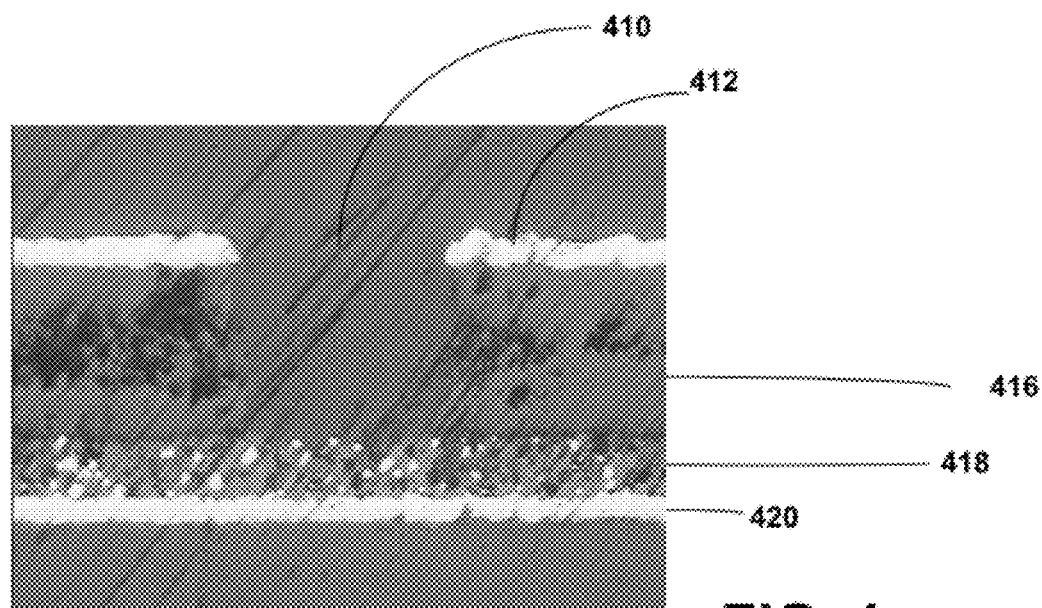
FIG. 4 illustrates an actual laser drilled hole for opening 314, under an embodiment.

FIG. 4 illustrates an actual laser drilled hole for opening 314, under an embodiment. The hole 414 may be drilled using a commercially available laser; such as an Excimer, YAG, or CO2 laser. Embodiments recognize that the laser may be selected based on the properties of the VSD material, for example, a CO2 laser could light scatter and is unable to safely drill for a given type of VSD material. However, a YAG laser for the same VSD material can readily create the hole 414, which penetrates an outer electrode 412 and the prepreg (or other electrically isolative material) 416. The opening 410 may extend to reach the VSD material layer 418, which is in contact or overlaid onto the second electrode 420. But as mentioned with previously, the laser that creates the hole 410 can have capability to detect transition from prepreg 416 to VSD material 420. The ability to detect the transition instantly enables the hole 410 to be created to reach, but not extend into the layer of VSD material. Optionally the hole 410 may be cleaned free of loose resin by plasma or chemical etching (de-smear).

Multi-Layer Structure

Figure 5:
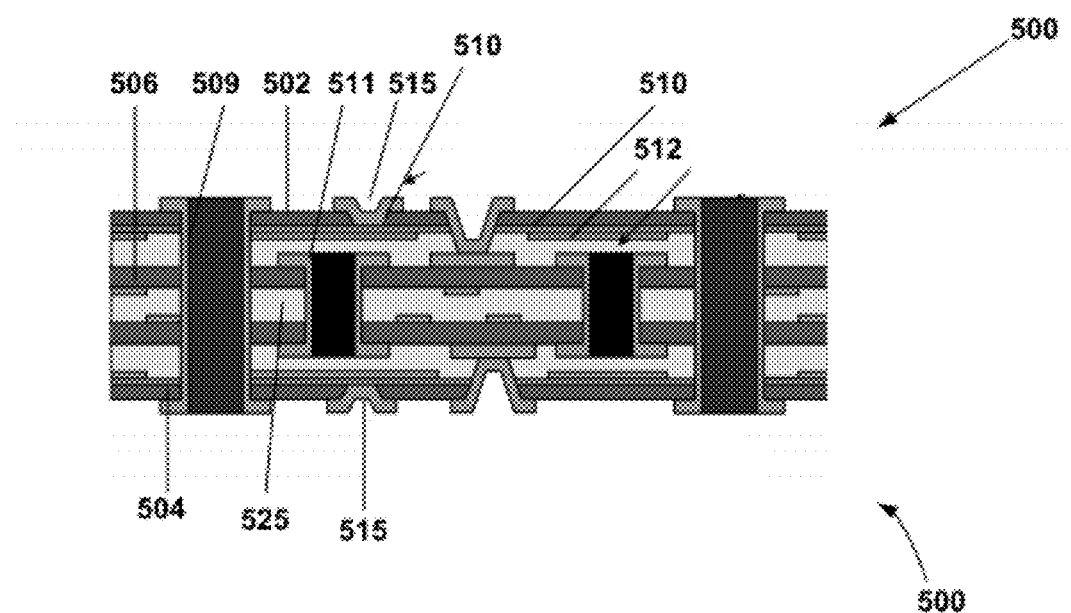
FIG. 5 shows a multi-layered printed circuit board (or other substrate device) that incorporates a vertical switching layer of VSD material, in accordance with one or more embodiments.

A substrate device configuration such as depicted in FIG. 2A can be stacked or integrated as a separate thickness within a larger substrate. FIG. 5 shows a multi-layered (8 layer) printed circuit board (or other substrate device) that incorporates a vertical switching layer of VSD material, in accordance with one or more embodiments. In a typical circuit board configuration for small electronic devices (such as cell phones), the layers are provided by a combination of laminations, drills, and plating cycles. For example, a high density interconnect (HDI) multi-layered PCB configurations can typically use a 2+4+2 or 1+1+4+1+1 Stackup which requires multiple laminations, drills, and plating cycles.

With reference to FIG. 5, core layer 502 overlays VSD material 510 on both sides of the substrate 500. The VSD material 510 is formed to be adjacent to the ground plane 512 on both sides of the PCB. Additional core layers 504, 506 are provided within the substrate 500. Each core layer 502, 504, 506 includes conductive materials on one or both sides. Layers of electrically isolative material 525 may be distributed between the core layers.

The substrate 500 may include different types of vias, including (i) thru vias 509 that extend through the thickness of the entire substrate, in order to electrically connect elements on each exterior side of the substrate; (ii) buried vias 511 that electrically interconnect elements of two or more interior core layers; and (iii) micro-vias 515, which are laser drilled to extend one or more conductive layers to VSD material for ground protection. For example, an electrode 521 is formed over an opening that is extended to the upper layer of VSD material 510, to separate that electrode from the grounding plane 512 that underlies the layer of VSD material. Some conductive elements may be drilled through the VSD material to interconnect elements of an exterior core with one of an interior core layer. Numerous other variations are also possible.

With reference to electrode 521, for example, by laser drilling with a YAG laser (i.e. Excellon Cobra) then plating, connection can be made from the outer layer to the VSD material layer 510. The VSD material "turn on" voltage (or energy) is characterized by the VSD material formulation and VSD layer thickness. The composition of VSD material may be selected for a desired characteristic, including the clamping voltage. A standard electroplating, electroless plating, "build up", or pattern replication can be used to plate drilled openings, as well as other formations on the layers.

With regard to an embodiment of FIG. 5 or elsewhere (e.g. FIG. 2A), the layer VSD may be either continuous or non-continuous (i.e. patterned) as it spans a given thickness of the substrate device.

Figure 6:
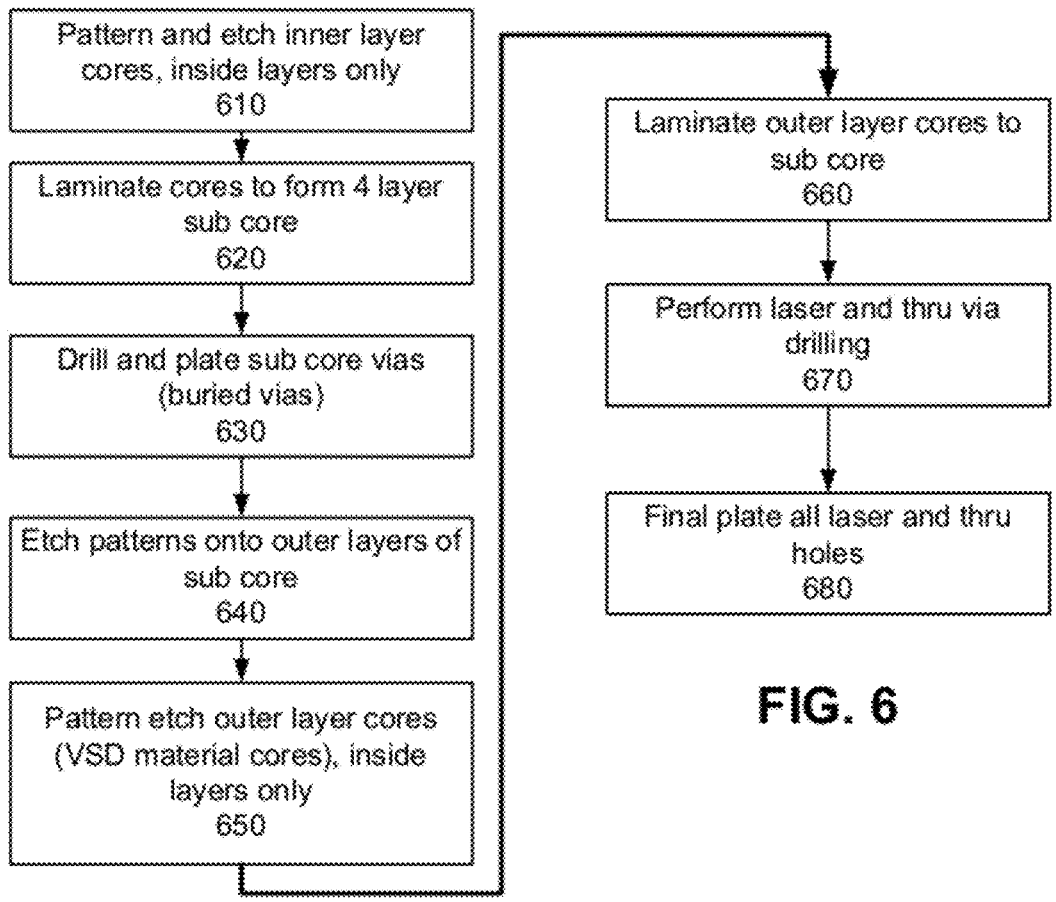
FIG. 6 illustrates a process flow of a multi-layer printed circuit board that uses an embedded layer of VSD material to provide a vertically switched protective element for transient electrical events, under an embodiment of the invention.

FIG. 6 illustrates a process flow of a multi-layer substrate device (e.g.) printed circuit board that uses an embedded layer of VSD material to provide a vertically switched protective element for transient electrical events, under an embodiment. A process flow consistent with as described in FIG. 6 may be used to implement an embodiment such as described with FIG. 5. Accordingly, reference is made to elements of FIG. 5 for purpose of illustrating suitable elements or features in relation to a step or sub-step being described. The process steps that are discussed may be varied to accommodate the formation of different kinds of multi-layer substrate device. The process may be simplified to accommodate single or double layer substrate devices, or performed with additional steps to accommodate more heavily layered substrate devices.

In step 610, the inner layer cores (L4 and L5) of the multi-layered substrate device is subjected to stand processes that include imaging and etching. Step 620 provides that the cores are laminated to form a four layer sub-core. Step 630 provides that the buried vias 511 are formed in the sub-core. Drill and plate processes may be performed to form the buried vias 515.

In step 640, patterns are etched onto the outer layers of the sub core. Next, step 650 provides that the inside layers of the outer layer cores are pattern etched. In step 660, the outer layer cores are laminated to the sub core.

In step 670, multiple drill steps are performed to form the thru vias 609 and micro-vias 515. As mentioned, the micro-vias may be formed using precision laser drilling, such as described with an embodiment of FIG. 3A through FIG. 3C.

Step 680 provides for final plating all laser and through holes. As mentioned, when the micro-vias 515 are plated, they form electrodes that intermittingly (i.e. when transient electrical conditions are present) ground the corresponding interconnected elements to the nearest grounding plane across a vertical gap thickness of the VSD material.

Many variations or alternatives to the process flow may also be incorporated in which (i) an embedded layer of VSD material (continuous or patterned) is formed and provided in contact or in connection with a grounding plane, and (ii) a conductive opening is drilled and then formed to extend to at least the VSD material.

Alternatives

While some embodiments described provide for opening or holes (that are subsequently plated or provided with electrical material) to be formed by a laser, one or more embodiments contemplate that the holes or openings may be formed by conventional mechanical drilling. For example, an embodiment of FIG. 7 illustrates a variation to an embodiment shown in FIG. 2A. In FIG. 7, the first electrode 710 extends into a thickness T of the VSD layer 230. Different implementations (such as drilling techniques) and embodiments may provide for the depth at which the first electrode 710 is extended. In some implementations, the first electrode may be extended to occupy anywhere between 10-80% of the thickness of the VSD layer 230. Mechanical drilling may be used to form the opening from which the first electrode 710 is formed, similar to a process depicted by FIG. 3A through FIG. 3C (except the mechanical drill is used in place of the laser in FIG. 3B).

Additionally, one or more embodiments provide that numerous layers of electrodes and VSD material may be provided in either continuous or non-continuous form.

As another alternative for enabling use of VSD material in a vertical switching arrangement, a "build up" process may be used to form a vertical opening into the stack to electrically contact an embedded layer of VSD material. In an embodiment, a "build up" process be used to make these structures. A photoimagable dielectric layer may be deposited in the VSD material, patterned, and then the conductor layer may be built up from the patterned dielectric layer. A pattern replication technology could also be used to pattern the dielectric layer and/or VSD material layer.

CONCLUSION

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. Therefore, the absence of describing combinations should not preclude the inventor from claiming rights to such combinations.

The invention claimed is:

1. A device comprising:
   a first electrode;
   a second electrode vertically spaced from the first electrode;
   a layer of voltage switchable dielectric (VSD) material that is positioned between the first electrode and the second electrode, the layer of VSD material being in contact with the second electrode, wherein the VSD material is triggerable to switch from a non-conductive state into a conductive state with application of energy that exceeds a designated threshold level;
   a layer of electrically isolative material provided between the layer of VSD material and the first electrode; and
   wherein the first electrode extends vertically into the layer of electrically isolative material so as to make contact with the layer of VSD material.

2. A substrate device comprising:
   a grounding electrode;
   a layer of voltage switchable dielectric (VSD) material overlaying the grounding electrode, wherein the VSD material is triggerable to switch from a non-conductive state into a conductive state with application of energy that exceeds a designated threshold level;
   a layer of electrically isolative material formed over the layer of VSD material; and
   a first electrode that extends in a vertical dimension through the layer of electrically isolative material to at least contact, but not extend through, the layer of VSD material, so as to provide a grounding path from the first electrode to the grounding electrode in presence of a transient electrical event that supplies energy in excess of the designated threshold to at least a portion of the layer of VSD material.

3. The substrate device of claim 2, wherein the first electrode extends to make contact with the layer of VSD material without measurably affecting a thickness of the layer of VSD material by more than 20%.

4. The substrate device of claim 2, wherein the first electrode extends to make contact with the layer of VSD material without measurably affecting a thickness of the layer of VSD material by more than 100 nanometers.

5. The substrate device of claim 2, wherein the electrically isolative material is prepregnated material.

6. The substrate device of claim 2, wherein the layer of VSD material includes either organic or inorganic high aspect ratio particles.

7. The substrate device of claim 2, wherein the layer of VSD material includes carbon nanotubes.

8. A multi-layered substrate device comprising:
   a plurality of core layers, including an interior core layer and an exterior core layer;
   one or more grounding planes embedded within a thickness of the substrate device, between at least two core layers;
   one or more layers of VSD material overlaying and in contact with the grounding plane, wherein the one or more layers of VSD material are triggerable to switch from a non-conductive state into a conductive state with an occurrence of an electrical transient event that exceeds a characteristic voltage;
   one or more layers of electrically isolative material separating each of the one or more layers of VSD material from at least one of the core layers;
   wherein the exterior core layer includes a grounding electrode and overlays one of the layers of electrically isolative material;
   wherein the one or more layers of VSD material include an exterior layer of VSD material underlying the layer of electrically isolative material that underlies one of the exterior core layers;
   wherein grounding electrode extends through the underlying layer of electrically isolative material to reach the underlying layer of VSD material, in order to enable at least a portion of conductive elements of the exterior core layer to be grounded when an electrical transient event occurs that exceeds the characteristic voltage of the layer of VSD material.

9. The multi-layered substrate device of claim 8, wherein the electrically isolative material is epoxy impregnated glass cloth.

* * * * *